(12) United States Patent
Gotti et al.

(10) Patent No.: US 11,575,085 B2
(45) Date of Patent: *Feb. 7, 2023

(54) TECHNIQUES FOR FORMING MEMORY STRUCTURES

(71) Applicant: Micron Technology, Inc., Boise, ID (US)

(72) Inventors: Andrea Gotti, Boise, ID (US); Pavan Reddy K. Aella, Eagle, ID (US); Dale W. Collins, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/165,549

(22) Filed: Feb. 2, 2021

(65) Prior Publication Data

US 2021/0234097 A1 Jul. 29, 2021

Related U.S. Application Data

(63) Continuation of application No. 16/456,349, filed on Jun. 28, 2019, now Pat. No. 10,930,849.

(51) Int. Cl.
*H01L 45/00* (2006.01)
*G11C 13/00* (2006.01)
*H01L 27/24* (2006.01)

(52) U.S. Cl.
CPC ...... *H01L 45/1675* (2013.01); *G11C 13/0026* (2013.01); *G11C 13/0028* (2013.01);
(Continued)

(58) Field of Classification Search
CPC .............. H01L 45/1675; H01L 45/146; H01L 45/1625; H01L 27/2481; H01L 45/141;
(Continued)

(56) References Cited

U.S. PATENT DOCUMENTS 7,498,064 B2 * 3/2009 Horii ................ H01L 21/76816
257/2
7,767,491 B2 * 8/2010 Horii .................... H01L 45/1641
438/102
(Continued)

FOREIGN PATENT DOCUMENTS

CN 105051875 A 11/2015
CN 106165085 A 11/2016
(Continued)

OTHER PUBLICATIONS

Notification of Reason for Refusal received for Korean Patent Application No. 10-2020-0076423, dated Jan. 1, 2022, 14 pages (8 pages of English Translation and 6 pages of Original Document).
(Continued)

*Primary Examiner* — Vu A Vu
(74) *Attorney, Agent, or Firm* — Holland & Hart LLP

(57) ABSTRACT

Methods, systems, and devices for techniques for forming memory structures are described. Forming a memory structure may include etching a stack of material including a conductive line, a first electrode and a sacrificial material to divide the stack of material into multiple sections. The process may further include depositing an oxide material in each of the first quantity of channels to form multiple oxide materials. The sacrificial material may be etched to form a second channel between two oxide materials of the multiple oxide materials. Memory material may be deposited over the two oxide materials and the second channel, which may create a void in the second channel between the memory material and the first electrode. The memory material may be heated to fill the void in the second channel.

20 Claims, 8 Drawing Sheets

(52) U.S. Cl.
CPC ...... *H01L 27/2436* (2013.01); *H01L 27/2481* (2013.01); *H01L 45/1253* (2013.01); *H01L 45/141* (2013.01); *H01L 45/146* (2013.01); *H01L 45/1625* (2013.01); *H01L 45/1683* (2013.01)

(58) Field of Classification Search
CPC ............. H01L 45/1683; H01L 27/2436; H01L 45/1253; G11C 13/0026; G11C 13/0028
USPC ........................................................... 257/4
See application file for complete search history.

(56) References Cited

U.S. PATENT DOCUMENTS

| | | | |
|---|---|---|---|
| 7,901,979 B2 * | 3/2011 | Lung | ...................... H01L 45/16 438/102 |
| 8,865,558 B2 | 10/2014 | Park et al. | |
| 10,930,849 B2 * | 2/2021 | Gotti | ................... H01L 45/1675 |
| 2011/0121253 A1 | 5/2011 | Lung | |
| 2019/0109177 A1 | 4/2019 | Chanemougame et al. | |

FOREIGN PATENT DOCUMENTS

| | | |
|---|---|---|
| CN | 108417236 A | 8/2018 |
| KR | 10-2013-0007759 A | 1/2013 |
| KR | 10-2016-0044142 A | 4/2016 |

OTHER PUBLICATIONS

IPA/CN, "Office Action," issued in connection with China Patent Application No. 202010493027.4, dated Jun. 23, 2021 (4 pages).

* cited by examiner

TECHNIQUES FOR FORMING MEMORY STRUCTURES

CROSS REFERENCE

The present Application for Patent is a continuation of U.S. patent application Ser. No. 16/456,349 by Gotti et al., entitled "TECHNIQUES FOR FORMING MEMORY STRUCTURES," filed Jun. 28, 2019, assigned to the assignee hereof, and is expressly incorporated by reference in its entirety herein.

BACKGROUND

The following relates generally to a system that includes at least one memory device and more specifically to techniques for forming memory structures.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide memory technologies, and others. Memory devices may be volatile or non-volatile. Improving memory devices, generally, may include increasing memory cell density, increase read/write speeds, increasing reliability, increasing data retention, reducing power consumption, or improving manufacturing processes, among other metrics. Improved solutions for saving space in the memory array, increasing the memory cell density, or manufacturing smaller memory cells for a memory array may be desired.

DETAILED DESCRIPTION

Figure 1:
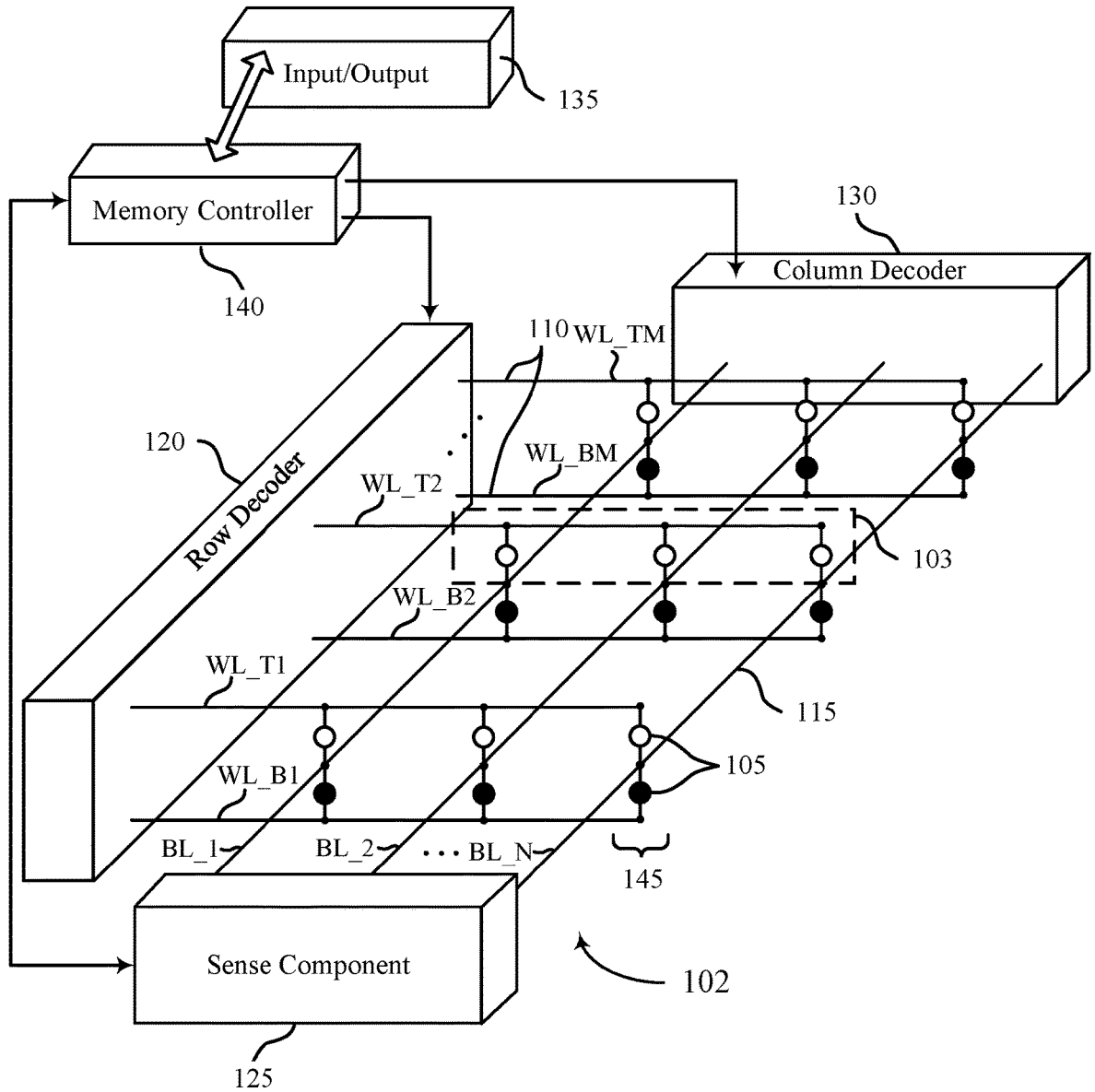
FIG. 1 illustrates an example of a memory device in accordance with examples as disclosed herein.

It may be desirable to form smaller memory cells, for example, to increase the storage density of a memory array, decrease power consumption per memory cell, decrease manufacturing costs, etc. However, it may be difficult to control manufacturing processes such as etching processes to form memory cells below a certain size. For example, etching a stack of material to form smaller memory cells may include removing sections of the stack that are closer together. However, as memory cell structures become smaller, secondary effects from manufacturing processes (e.g., etch damage, material contamination, etc.) may have a greater impact on the structure and function of the final memory cell. For example, etch damage to memory material that was acceptable for larger size memory cells may affect a larger percentage of a smaller memory cell. Accordingly, manufacturing processes used to manufacture larger memory cells may cause damage to smaller memory cells such as contamination or erosion, which prevent these processes from reliably forming memory cells at a smaller scale.

Processes for forming memory cells may include using an initial stack of material that includes a sacrificial material and does not include a memory material. A sacrificial material may be used for one or more steps of the manufacturing process (e.g., etching, depositing insulative material, etc.) and then be removed. For example, the sacrificial material may be removed leaving other structures such as insulative sections that form a void for depositing memory material and conductive lines for coupling a memory cell to other structures. A memory material may be deposited over the voids/spaces that were left from the removal of the sacrificial material. In this regard, secondary effects (e.g., degradation, contamination, etc.) from the manufacturing steps performed when the sacrificial material was present may not affect the final memory material. Further, sacrificial materials may be chosen that are more resistant to secondary effects of the manufacturing process (e.g., etching).

The memory material may be deposited using a deposition process that results in greater purity of the memory material. For example, a physical layer deposition (PVD) process may reduce contamination in the memory material as compared to other deposition processes, such as an atomic layer deposition (ALD). The deposition process may result in the memory material covering, but not entirely filling the void/space left from removing the sacrificial material. For example, the size of the void or space for forming the memory cell may be small enough that material properties of the memory material such as viscosity, surface tensions, or the like prevent the memory material from completely filing the space. After the deposition process, the memory material may be heated to cause the memory material to move into and fill the voids left by the sacrificial material. In some cases, pressure may also be applied during at least part of the heating process. Accordingly, smaller scale memory cells may be formed using processes that reduce damage and/or increase purity of the memory material during manufacturing processes.

Features of the disclosure are initially described in the context of memory devices as described with reference to FIGS. 1-2. Features of the disclosure are described in the context manufacturing processes as described with reference to FIGS. 3A-H. These and other features of the disclosure are further illustrated by and described with reference to flowcharts that relate to techniques for forming memory structures as described with references to FIGS. 4-5.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing a word line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized to read or write a memory cell 105 at their intersection. Other memory cells 105 that are in electronic communication with (e.g., connected to) the same access line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled BL_1 through BL_N, where M and N depend on the array size. Thus, by activating a word line 110 and a bit line 115, e.g., WL_2 and BL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the memory cell for achieving the results described herein. This example of a mechanism should not be considered limiting. This disclosure also includes other examples of mechanisms of the memory cell for achieving the results described herein.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component may be associated either with column decoder or row decoder.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying the first voltage to the memory cell 105 as part of the access operation based on coupling the first conductive line of the decoder (e.g., row decoder 120 or column decoder 130) with the access line (e.g., word line 110 or bit line 115).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with a word line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. In some cases, the second voltage may cause the doped material to selectively couple the first conductive line of the decoder with the access line associated with the memory cell 105. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may be configured to store a logic state in the memory cell 105 based on applying the first voltage to the memory cell 105.

Figure 2:
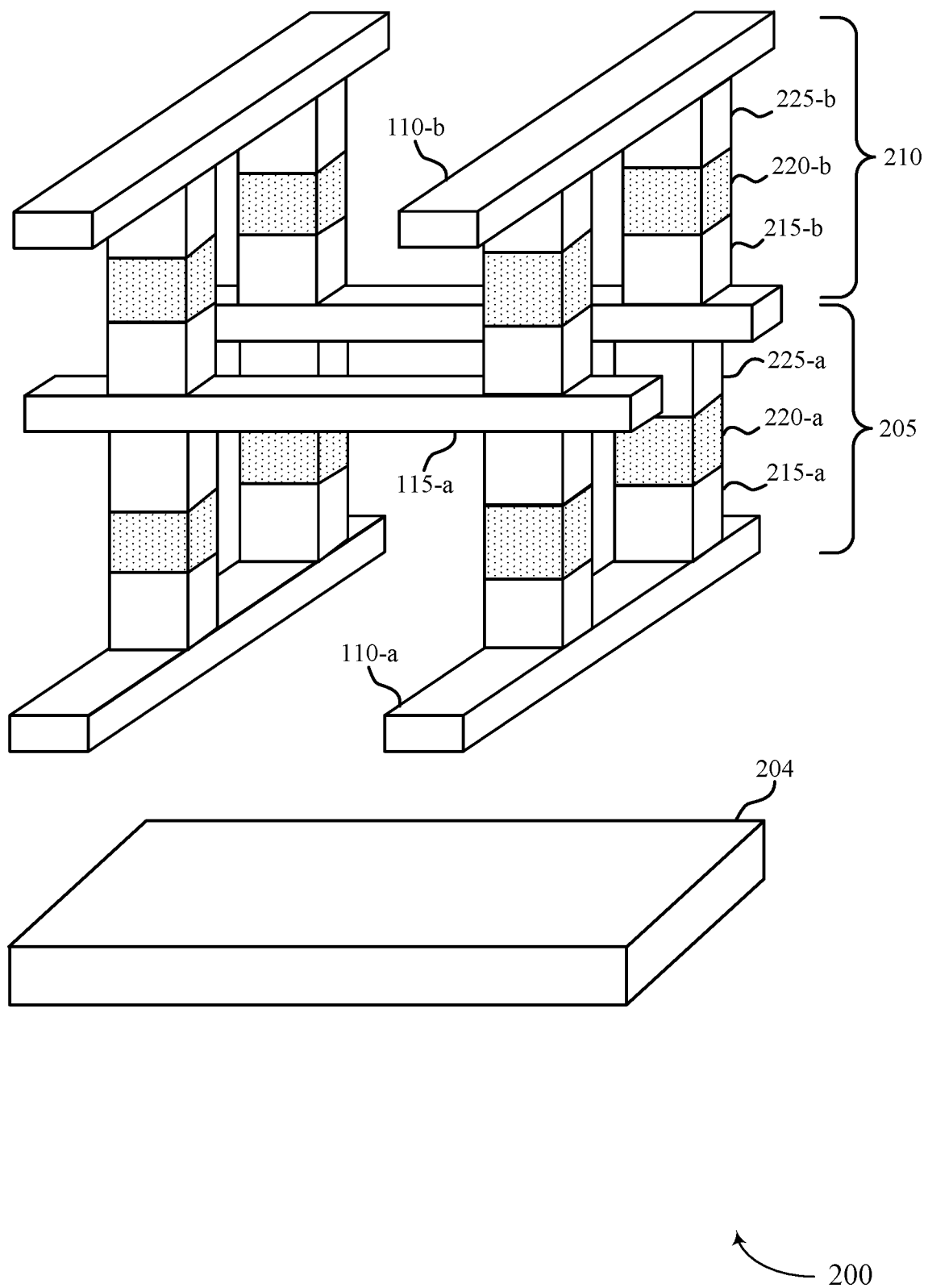
FIG. 2 illustrates an example of a memory array that supports a memory device in accordance with examples as disclosed herein.

FIG. 2 illustrates an example of a memory device 200 that as disclosed herein. Memory device 200 may be an example of portions of memory array 102 described with reference to FIG. 1. Memory device 200 may include a first array or deck 205 of memory cells that is positioned above a substrate 204 and second array or deck 210 of memory cells on top of the first array or deck 205. Memory device 200 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more memory cell (e.g., memory cell 220-*a* and memory cell 220-*b*, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-*a*, memory cell 220-*a* (e.g., including chalcogenide material), and second electrode 225-*a*. In addition, memory cells of the second deck 210 may include a first electrode 215-*b*, memory cell 220-*b* (e.g., including chalcogenide material), and second electrode 225-*b*. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent memory cells. In accordance with the teachings herein, a decoder may be positioned above or below each deck if the memory device 200 includes more than one deck. For example, a decoder may be positioned above first deck 205 and above second deck 210. In some cases, the memory cells 220 may be examples of phase-change memory cells or self-selecting memory cells.

The architecture of memory device 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a memory cell 220 including chalcogenide material may be programmed to a logic state by applying a first voltage. By way of example, when a particular memory cell 220 is programed, elements within the cell separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

For example, if a memory cell has a given distribution of ions, the threshold voltage detected during the read operation may be different for a first read voltage with a first polarity than it is with a second read voltage having a second polarity. Depending on the polarity of the memory cell, this concentration of migrating ions may represent a logic "1" or logic "0" state. This description of ion migration represents an example of a mechanism of the memory cell for achieving the results described herein. This example of a mechanism should not be considered limiting. This disclosure also includes other examples of mechanisms of the memory cell for achieving the results described herein.

In some cases, a first voltage may be applied to a first conductive line of a decoder as part of an access operation of the memory cell 220. Upon applying the first voltage, the first conductive line may be coupled with the access line (e.g., word line 110-a, word line 110-b, or bit line 115-a) associated with the memory cell 220. For example, the first conductive line may be coupled with the access line based on a doped material of the decoder which extends between the first conductive line and the access line in a first direction.

In some examples, the first voltage may be applied to the memory cell 220 based on coupling the first conductive line of the decoder with the access line. The decoder may include one or more doped materials that extend between the first conductive line and the access line of the memory device 200 of memory cells in a first direction away from a surface of the substrate 204. In some cases, the decoder may be coupled with the substrate 204.

FIGS. 3A-H illustrate a manufacturing process that includes performing a series of operations on a stack of material to form one or more memory cells of a memory array. These figures illustrate examples of intermediate structures that may be formed by performing operations of the manufacturing process on a stack of material. The structures illustrated in FIGS. 3A-3H provide an example of a sequence of operations for the manufacturing process. In other cases, the manufacturing process may include combining various operations, altering the sequence of operations, eliminating one or more operations or steps of these operations, or any combination thereof.

Figure 3A:
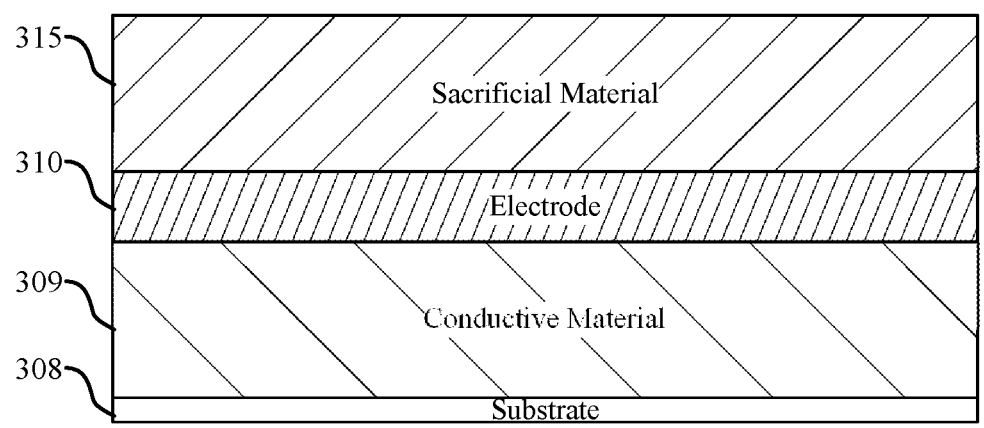
FIGS. 3A-H illustrate an example of a manufacturing process that supports techniques for forming memory structures in accordance with examples as disclosed herein.

FIG. 3A illustrates a cross-sectional view of an example of a stack of material 300 that supports techniques for forming memory structures in accordance with examples as disclosed herein. The stack of material 300 may include a substrate 308, which may be an example of the substrate 204 described with reference to FIG. 2, a conductive material 309, an electrode 310 and a sacrificial material 315. The stack of material 300 may undergo one or more manufacturing processes to form memory cells of a memory array, such as memory array 102 and memory device 200 described with reference to FIGS. 1 and 2.

The stack of material 300 may include a layer of conductive material 309 deposited onto or coupled with the substrate 308. The layer of conductive material 309 may undergo one or more manufacturing processes to form conductive lines of a memory array. For example, the layer of conductive material 309 may be etched to form a word lines for one or more memory cells, such as word lines 110 described with reference to FIGS. 1 and 2. In some cases, the conductive material 309 may form a single continuous layer of the stack of material 300 and one or more manufacturing processes (e.g., etching) may be performed to form the layer of conductive material 309 into multiple discrete structures of a memory array (e.g., series of parallel word lines). In other examples, the conductive material 309 may be deposited or formed on the substrate 308 in a pattern to form one or more structures (e.g., conductive lines/paths) within the stack of material 300.

The stack of material 300 may include an electrode 310 coupled with the conductive material 309. The electrode 310 may form a layer of material coupled with a surface, such as the top surface, of the conductive material 309. The electrode 310 may be an example of electrodes 215 or 225 described with reference to FIG. 2. The electrode 310 may form a first contact with a memory material or memory cell of the memory array. In some cases, the electrode 310 layer may form a single continuous layer of material over the conductive material 309. In other cases, the electrode 310 may be deposited or formed on the conductive material 309 in a pattern to form one or more structures (e.g., electrode contacts) within the stack of material 300. In some cases, a pattern of the electrode 310 may match or correspond to a pattern of the conductive material 309.

The stack of material 300 may include a layer of sacrificial material 315 deposited onto or coupled with the electrode 310. The sacrificial material 315 may be used during one or more manufacturing steps for forming one or more structures of the array and then be removed and replaced with a second material. For example, the sacrificial material 315 may be etched away to form cavities during various manufacturing processes and replaced with a memory material that forms a memory cell, such as memory cells 105 and 220 as described with reference to FIGS. 1 and 2.

For portions of the manufacturing process, the sacrificial material 315 may form a top layer of the stack of material 300. In some cases, a mask may be applied or formed over the sacrificial material 315 and an etch process performed to remove specific portions of the stack of material 300. In some cases, the sacrificial material 315 is an example of a mask. In this regard, the sacrificial material 315 may be chosen based on its interaction to one or more manufacturing processes. For example, the sacrificial material 315 may be a material that maintains desired dimensional tolerances or is behaves predictably and repeatably to specific etch processes. That is, in cases where a stack of material includes a memory material instead of the sacrificial material 315, an etch process may degrade, damage or change the structure (e.g., surface chemistry) of the memory material. As the size of memory cells shrink, these manufacturing induced defects may limit the minimum size of a memory cell. For example, as memory cells get smaller the manufacturing induced defects may comprise a larger percentage of the total memory cell size and may result in memory cells that cannot reliable store data, for example, within one or more specifications. However, using the sacrificial material 315 may reduce contamination, degradation or changes in surface chemistry of a memory material. For example, using a sacrificial material may allow a memory material to be deposited onto the stack of material after one or more manufacturing operations are performed using the sacrificial material. Further, because the sacrificial material will be removed, and is not used to store or read memory states, the sacrificial material 315 may be chosen to provide manufacturing advantages such as greater dimensional stability during one or more manufacturing operations (e.g., etching or depositing insulative material as described herein). In some cases, the sacrificial material may include a silicon nitride material.

The stack of material 300 may be used to form multiple memory cells of a memory array. In some cases, for example in 3D memory structures, a first set/layer of memory cells may be formed from a first stack of material 300 and a second set/layer of memory cells may be formed on top of the first set/layer by depositing a second stack of material 300 onto the first set of memory cells. In some cases, a second or subsequent layer of memory cells may be formed by depositing a second stack of material 300 in a different direction than a first stack of material 300. For example, the second stack of material may be deposited or formed at an orthogonal orientation to the first stack of material. In some cases, a second or subsequent stack of material 300 may have fewer or different layers, materials or material compositions as compared to the first stack of the material 300. For example, a second stack of material 300 may not include the substrate 308, have a different conductive material 309, different electrode 310, different sacrificial material 315, different ordering of the layers (e.g., electrode 310 below the conductive material 309), or any combination thereof.

Figure 3B:
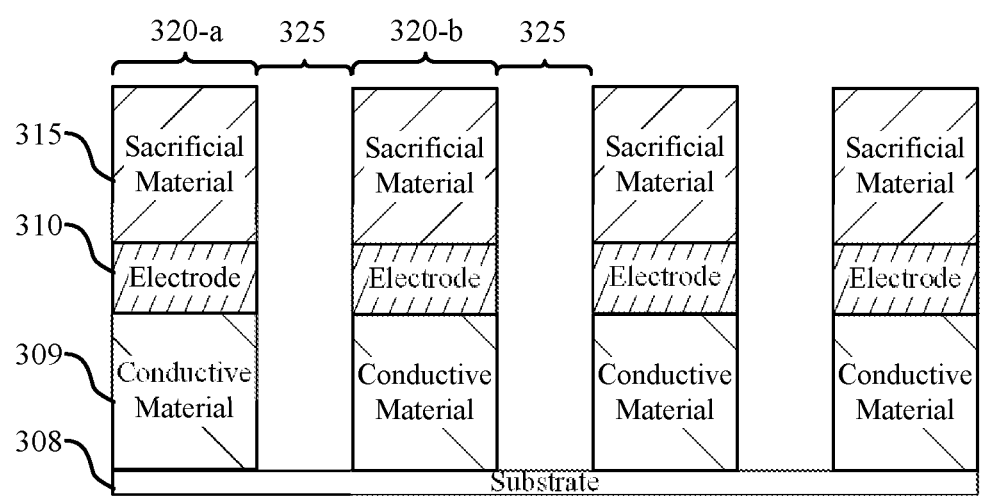

FIG. 3B illustrates a cross-sectional view of an example of a first structure 301 formed by an etching operation as part of a manufacturing process for forming memory structures in accordance with examples as disclosed herein. The etching operation may be performed on the stack of material 300 to form the first structure 301, and after performing the etching operation on the stack of material 300, the first structure 301 may include multiple stack sections 320 forming one or more channels 325.

The operation may include etching the stack of material 300 to remove defined portions (e.g., the channels 325) from the stack of material 300. The operation may include placing a mask over the top surface of the sacrificial material 315 and exposing the stack of material 300 to one or more etch processes.

The first structure 301 may include stack sections 320 that each include a layer of the conductive material 309, a layer of the electrode 310 and a layer of the sacrificial material 315 each of which were present in the initial stack of material 300. A first stack section 320-*a* may extend parallel to a second stack section 320-*b* and form the channel 325 between walls of the first and second stack sections 320-*a*, 320-*b*. In some cases, each stack section 320 may form a structure that extends along a first direction (e.g., into the plane of the page).

In some cases, the channels 325 may include a vertical structure, which may be the same as or similar to a vertical electrical connection (via) and may pass through one or more silicon wafers or dice. In some examples, the channels 325 may include horizontal structures or vertical and horizontal structures that on the same or different layers of a memory array. In some examples, the channels 325 may also include one or more traces along one or more layers or include a through silicon connection such as a via.

Figure 3C:
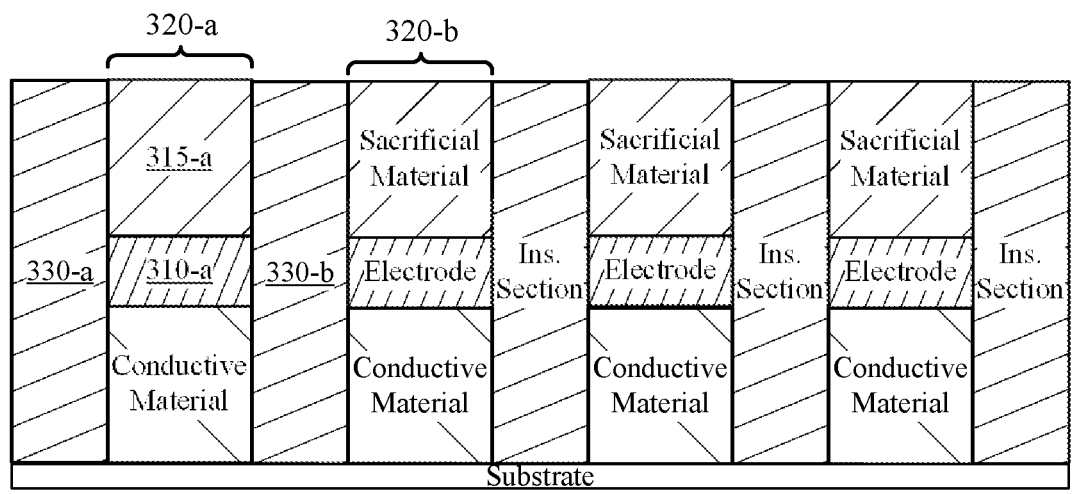

FIG. 3C illustrates a cross-sectional view of an example of a second structure 302 formed by a depositing operation as part of a manufacturing process for forming memory structures in accordance with examples as disclosed herein. The depositing operation may be performed on the first structure 301 to form the second structure 302, and after performing the depositing operation on the first structure 301, the second structure 302 may include multiple insulative sections 330 formed from filing the channels 325 with an electrically insulative material.

Each insulative section 330 may alternate with the stack sections 320. For example, the a first insulative section 330-*a* may be formed along a first side of a first stack section 320-*a* and a second insulative section 330-*b* may be formed along a second side of the first stack section 320-*a*. The insulative sections 330 may be formed to the same height as the stack sections 320 and be formed of a single insulative material. In some cases, the insulate material may be an oxide material that will separate adjacent memory cells of a memory array. For example, a first stack section 320-*a* may end up forming a first memory cell and a second stack section 320-*b* may form a second memory cell. In this regard, insulative section 330-*b* may form a boundary between these two memory cells.

In some cases, additional manufacturing processes such as a second etch and fill procedure may be performed in a second direction to divide each of the stack sections 320 and insulative sections 330 into multiple sections. In this regard, each stack section 320 may form multiple memory cells (not shown in this view).

Performing the depositing operation on a structure (e.g., first structure 301) that includes the sacrificial material 315 may provide one or more advantages for forming smaller memory cell elements. For example, forming smaller memory cells elements may include using insulative materials 330 or processes for depositing the insulative materials 330 that are harsher (e.g., have greater secondary manufacturing effects) on a memory material. In some cases, achieving smaller features may include using manufacturing operations that include, greater pressures, lower pressures, higher pressure gradients, higher temperatures, more aggressive deposition products (e.g., carriers, chemicals, precursors, etc.) relative to larger scale memory devices. For example, process used to fabricate memory devices on size scales above 30 nm may not be reliable for fabricating memory cell features below 30 nm, below 20 nm or below 10 nm. Accordingly, sacrificial material 315 may be less susceptible to damage (e.g., secondary manufacturing effects such as degradation, contamination, erosion, deformation, etc.) during operations used to fabricate smaller memory cell features. Additionally or alternatively, secondary effects such as contamination or surface chemistry changes introduced into the secondary material during the manufacturing operations may be removed during a subsequent etching process (e.g., as described herein) when the sacrificial material 315 is removed from the memory cell structure.

Figure 3D:
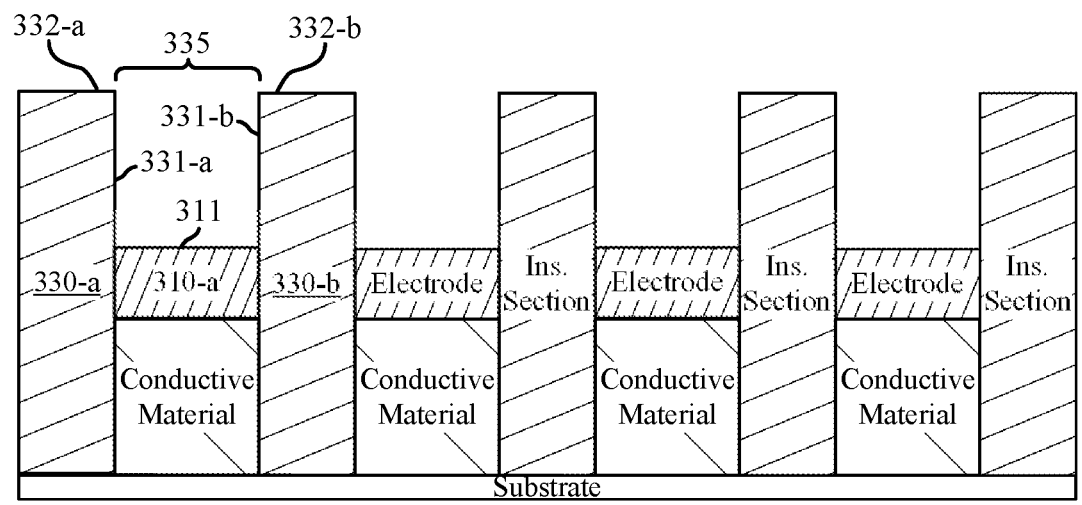

FIG. 3D illustrates a cross-sectional view an example of a third structure 303 formed by an operation that remove sacrificial material 315 as part of a manufacturing process for forming memory structures in accordance with examples as disclosed herein. The removal operation may be performed on the second structure 302 to form the third structure, and after removing the sacrificial material 315 from the second structure 302, the third structure 303 may include multiple insulative section 330 that form a second channel 335.

The third manufacturing operation may include removing the sacrificial material 315 from the second structure 302, for example using a wet etching process. Accordingly, a second channel 335 may be formed between a first insulative section 330-a and a second insulative sections 330-b and a first electrode 310-a. That is, the second channel 335 may include a first sidewall formed by a first surface 331-a of the first insulative section 330-a, a second sidewall formed by a second surface 331-b of the second insulative section 330-b and a bottom wall formed by an electrode surface 311 of the first electrode 310-a. A top surface of the channel 335 may be open, but in some cases a top of the channel may be considered to correspond to a first top surface 332-a of the first insulative section 330-a, a second top surface 332-b of the second insulative section 330-b, or a combination thereof. In some case, the second channel 335 may also be referred to as a gap, which may be formed by removing the sacrificial material 315.

The size and shape of the second channel may be based on the first manufacturing operation discussed in relation to FIG. 3B. For example, where the sacrificial material 315 is etched into substantial rectangular cross-sections, the first surface 311-a, the second surface 311-b and the electrode surface may form a substantially u-shaped boundary of the second channel 335 from a cross-sectional perspective. In some cases, the sacrificial material 315 may be etched or the first channels 325 formed that result in different geometries of the second channel. For example, etching and removing the sacrificial materials (e.g., as described herein) may result in a geometry of a second channel 335 that may be wider at the top surface (e.g., first and second top surfaces 332) than at the electrode surface 311. Accordingly, memory material deposited into the channel (e.g., as described in relation to FIGS. 3E-G) may form a memory cell that is slightly wider at top surfaces 332 of the insulative material 330 relative to the electrode surface. In some cases, this may contrast with a memory cells that was formed by etching a stack including memory material, in which the memory material may have a smaller cross section at a top surface (e.g., top surfaces 332) of the insulative sections 330 relative to the electrode surface 310.

Smaller memory cells may be fabricated by controlling the size of the second channel 335. For example, controlling a cross-sectional size of the second channel 335 may be based on the etching operation performed on the stack of material 300 including the sacrificial material 315 (e.g., as discussed in relation to FIGS. 3A-B). For example, a smaller memory cell may be formed by etching the first channels 325 closer together or etching the first channels to have a greater cross-sectional area. In some cases, smaller memory cells may also be formed by controlling the thickness of the sacrificial material 315 in the stack of material 300.

Figure 3E:
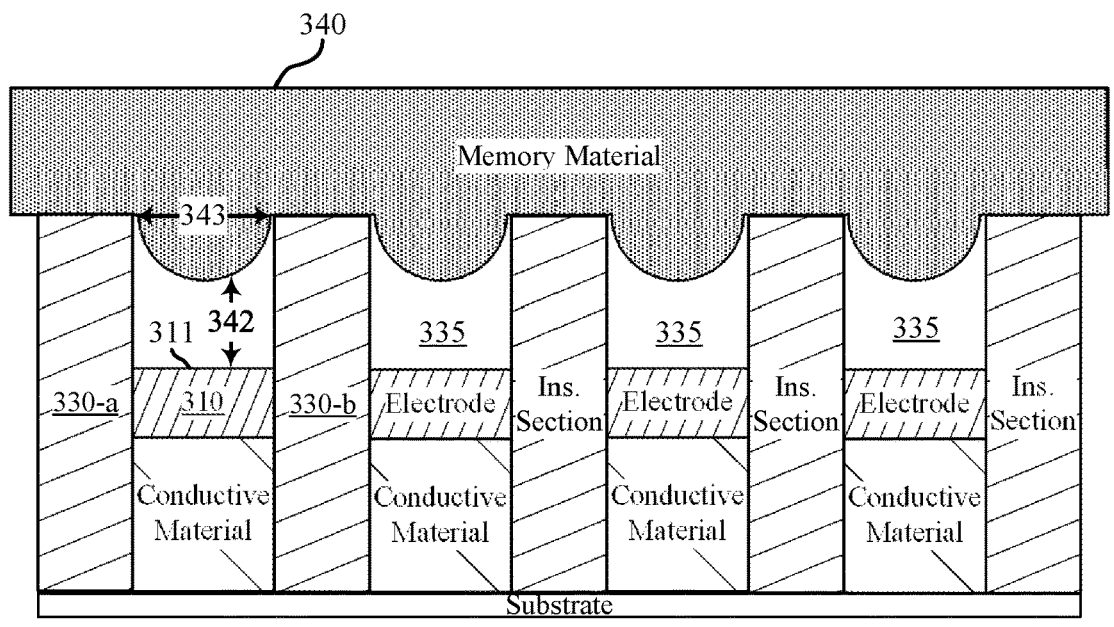

FIG. 3E illustrates a cross-sectional view of an example of a fourth structure 304 formed by a depositing operation as part of a manufacturing process for forming memory structures in accordance with examples as disclosed herein. The fourth structure 304 may be formed by depositing a memory material 340 over the third structure 303.

The memory material 340 may be deposited using a deposition process such as a PVD that coats a top surface of the third structure 303 to form the fourth structure 304. The PVD process may result in the memory material 340 partially filling the second channels 335 leaving a distance 342 between a bottom surface of the memory material 340 and the top electrode surface 311. For example, a cross-sectional distance 343 between the first insulative section 330-a and the second insulative section 330-b may be small enough, that the memory material 340 remains suspended between two adjacent insulative sections 330 and does not contact the electrode 310. This may be due to one or more properties of the memory material 340 during the deposition process. For example, a viscosity of the memory material 340, surface tension, the depth of the second channel/gap (e.g., second channel 335), one or more aspects of the deposition process (e.g., relative pressure) or a combination thereof may prevent the memory material 340 from contacting the electrode 310. In some cases, decreasing sizes of the memory cell may contribute to the distance 342 between a bottom surface of the memory material 340 and the electrode surface 311. In some examples, the distance 342 may define a portion of a gap or a void.

In some cases, the PVD process may include a silicon dioxide component as part of the memory material 340, which may reduce impurities or contamination in the memory material as compared to other deposition processes (e.g., ALD).

In some cases, the PVD processes may be performed to deposit a defined thickness of memory material onto the third structure 303. For example, a thickness of the memory material 340 may be based on one or more downstream processes that may be performed to form a final memory cell configuration. In some cases, the memory material may include a chalcogenide material, as described herein.

Figure 3F:
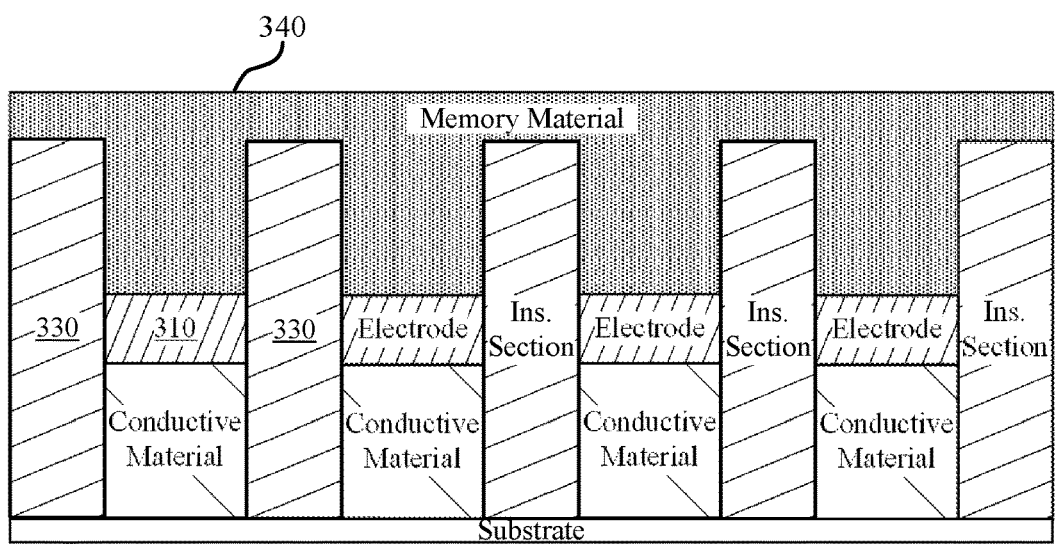

FIG. 3F illustrates a cross-sectional view of an example of a fifth structure 305 formed by a reflow operation as part of a manufacturing process for forming memory structures in accordance with examples as disclosed herein. The fifth structure 305 may be formed be performing a reflow operation to cause the memory material 340 to fill the second channel 335 and contact an electrode 310. The reflow operation may cause the memory material 340 to move the distance 342 that a bottom surface of the memory material 340 was suspended above the electrode.

The reflow operation may include heating the memory material 340. In some cases, the memory material 340 may be heated to modify one or more properties of the material. For example, the memory material 340 may be heated to a defined temperature based on a transition temperature, such as a glass transition temperature of the memory material 340. In some cases, the memory material may be heated above its glass transition temperature to facilitate moving or flowing the memory material into the second channels 335. In some cases, pressure may be applied to the memory material. For example, an increased pressure may be applied to the memory material 340 during at least a portion of the heating processes to help flow or move the memory material into the second channel 335.

An amount of memory material 340 may be deposited (e.g., during the PVD process) to at least fill each second channel 335. Accordingly, after the reflow process, the memory material may contact the electrode 310 and fill the second channels 335 to the height of the insulative sections 330. In some cases, after the reflow operation, the second channel 335 the memory material 340 may contact the electrode 310, substantially fill each channel 335 and include memory material above a top surface of the insulative sections 330. In some cases, filling the second channels 335 may include at least partially filling the second channel 335 such that the memory material 340 contacts at least a portion of the electrode. In some examples, after the reflow operation, the memory material 340 may include small voids, gaps, or other features. In some examples, filling the second channel 335 may include a continuous portion of memory material 340 contacting a portion of the electrode and extending to substantially the top of the channel 335 (e.g., to the top surfaces 332 of the insulative sections 330). In some cases, the memory material 340 may contact the electrode 310 and extend up at least a portion of the second channel 335, such that an electrode (or other material) deposited in a subsequent step contacts a top surface of the memory material 340. In additional examples, filling the second channel 335 may depend on depositing and reflowing in a volume of memory material 340 that may reliably store a memory state within one or more defined parameters. After the reflow process each second channel 335 (e.g., formed by removing the sacrificial material 315) may contain memory material 340.

Figure 3G:
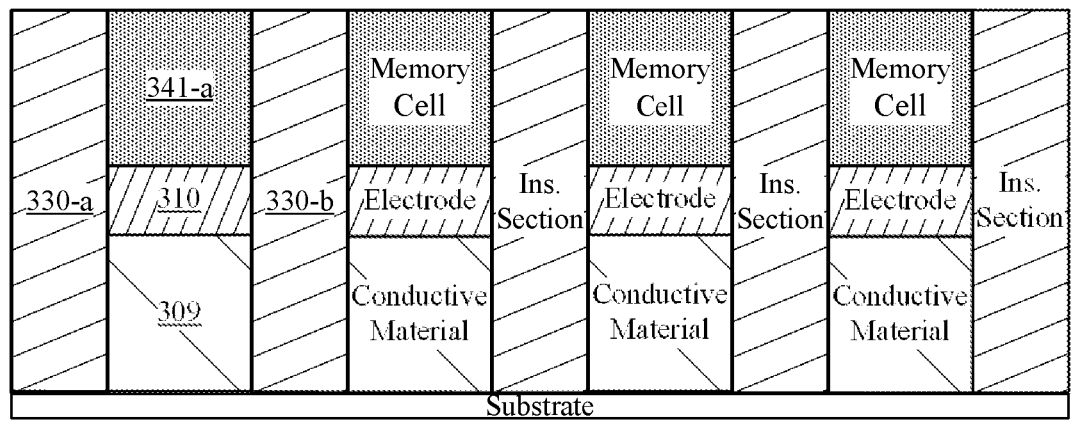

FIG. 3G illustrates a cross-sectional view of a sixth structure 306 formed from an etch back operation as part of a manufacturing process for forming memory structures in accordance with examples as disclosed herein. The sixth structure 306 may be formed using an etch process to remove a top layer of memory material 340 covering the insulative sections 330 from the fifth structure. Removing the top layer of memory material 340 to expose the insulative sections 330 may separate the continuous (or substantially continuous) volume of memory material 340 into multiple individual memory cells 341 separated by insulative sections (e.g., insulative sections 330).

After the etch procedure the sixth structure 306 may have alternating insulative sections 330 and memory cell 341 sections. For example, a first insulative section 330-a and a second insulative section 330-b may form structures on opposing sides of a first memory cell 341-a. In some cases, the insulative sections may extend the height of a stack section that includes a conductive material 309, an electrode 310 and a memory cell 341.

The etch procedure may be performed on a top surface of the fifth structure 305 to form the sixth structure 306. For example, the etch process may be performed across an entire top surface of the fifth structure 305. In this regard, the etch may evenly remove material from the top surface of the fifth structure 305 to expose both the insulative sections 330 forming the memory cells 341. In some cases, the etch process may leave a flat top surface (or one that is nearly flat) of the sixth structure 306.

Figure 3H:
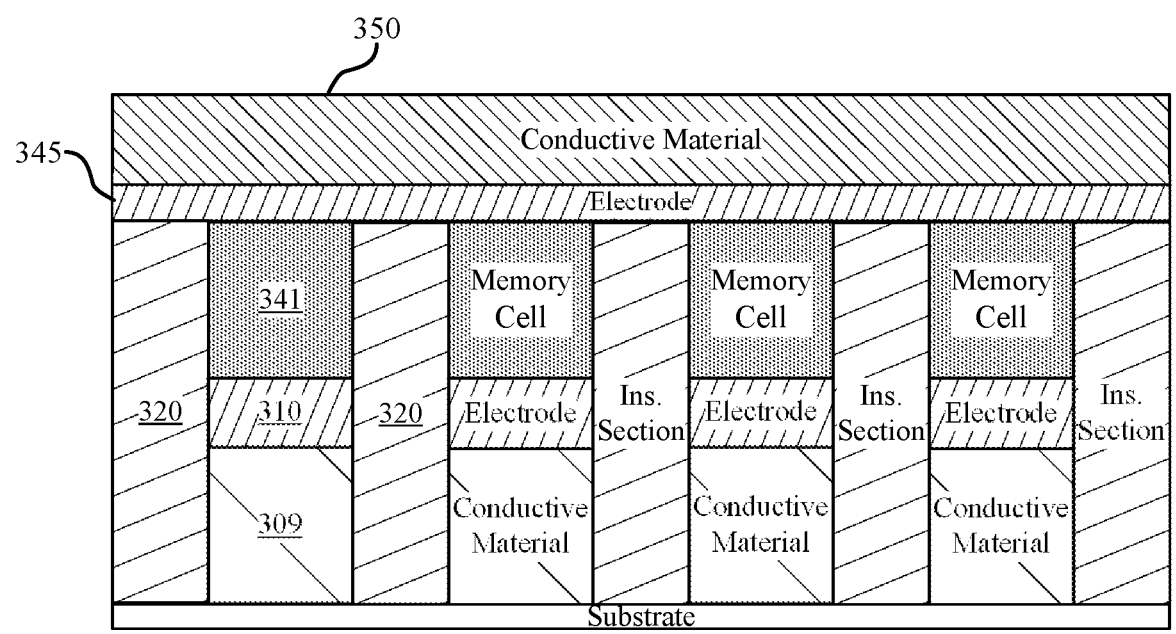

FIG. 3H illustrates a cross-sectional view of an example of a seventh structure 307 formed from additional deposition operations as part of a manufacturing process for forming memory structures in accordance with examples as disclosed herein. The seventh structure 307 may be formed by depositing a second electrode 345 onto the sixth structure 306 followed by depositing a conductive material 350 onto the second electrode 345.

The second electrode 345 may be the same of different material from the first electrode. The second electrode 345 may be deposited to form a conductive line that extends along a second direction that is different from the first direction. For example, the electrodes 310 may extend along the same direction of the conductive material 309 that forms a first set of word lines (e.g., word lines 110 described with reference to FIG. 1) and the second electrodes 345 may extend across multiple different memory material 340 segments. In some cases, the electrodes 310 and second electrodes 345 may be disposed at an orthogonal relationship relative to each other. In this regard, electrodes 310 may contact a first set of memory cells (e.g., memory material 340 segments) and the second electrode 345 may contact a second set of memory cells that are different from the first set of memory cells. In some case, multiple second electrodes 345 may be deposited or formed on the seventh structures. For example, multiple second electrodes 345 may be disposed as conductive lines running parallel to each other.

The second conductive material 350 may be deposited or formed onto the second electrode 345. The second conductive material 350 may form a set of conductive lines that may function as bit lines in a memory array, such as bit lines 115 described herein. Similar to the second electrode 345, the second conductive material 350 may be disposed in a different orientation relative to the conductive material 309. Accordingly, the conductive material 309 may be electrically coupled with a first set of memory cells and the second conductive material may be coupled with a second set of memory cells that is different from the first set.

Figure 4:
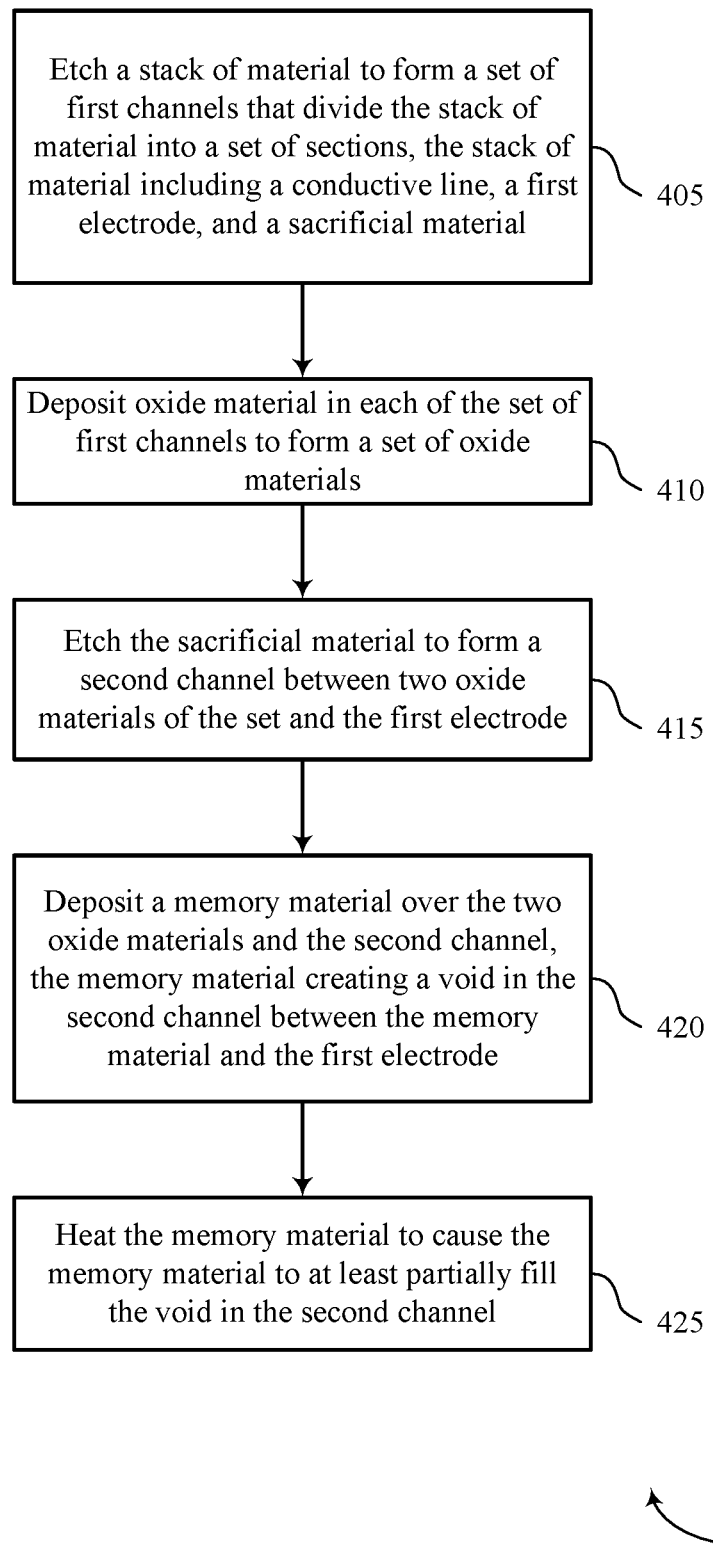
FIGS. 4 and 5 show flowcharts illustrating a method or methods that support techniques for forming memory structures in accordance with examples as disclosed herein.

FIG. 4 shows a flowchart illustrating a method or methods 400 that supports techniques for forming memory structures in accordance with aspects of the present disclosure. The operations of method 400 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 405, the method 400 may etch a stack of material to form a set of first channels that divide the stack of material into a set of sections, the stack of material including a conductive line, a first electrode, and a sacrificial material. The operations of 405 may be performed according to the methods described herein. In some cases, the channels 325 may include a vertical structure, which may be the same as or similar to a vertical electrical connection (via) and may pass through one or more silicon wafer or die. In some examples, the channels 325 may include horizontal structures or vertical and horizontal structures that on the same or different layers of a memory array. In some examples, the channels 325 may also include one or more traces along one or more layers or include a through silicon connection such as a via.

At 410, the method 400 may deposit oxide material in each of the set of first channels to form a set of oxide materials. The operations of 410 may be performed according to the methods described herein.

At 415, the method 400 may etch the sacrificial material to form a second channel between two oxide materials of the set and the first electrode. The operations of 415 may be performed according to the methods described herein.

At 420, the method 400 may deposit a memory material over the two oxide materials and the second channel, the memory material creating a void in the second channel between the memory material and the first electrode. The operations of 420 may be performed according to the methods described herein.

At 425, the method 400 may heat the memory material to cause the memory material to at least partially fill the void in the second channel. The operations of 425 may be performed according to the methods described herein.

In some examples, an apparatus as described herein may perform a method or methods, such as the method 400. The apparatus may include features, means, or instructions (e.g., a non-transitory computer-readable medium storing instructions executable by a processor) for etching a stack of material to form a set of first channels that divide the stack of material into a set of sections, the stack of material including a conductive line, a first electrode, and a sacrificial material, depositing oxide material in each of the set of first channels to form a set of oxide materials, etching the sacrificial material to form a second channel between two oxide materials of the set and the first electrode, depositing a memory material over the two oxide materials and the second channel, the memory material creating a void in the second channel between the memory material and the first electrode, and heating the memory material to cause the memory material to at least partially fill the void in the second channel.

Some examples of the method 400 and the apparatus described herein may further include operations, features, means, or instructions for etching the memory material to expose a surface of the set of oxide materials after heating the memory material. Some examples of the method 400 and the apparatus described herein may further include operations, features, means, or instructions for etching the memory material exposes a section of the memory material between the set of oxide materials. Some examples of the method 400 and the apparatus described herein may further include operations, features, means, or instructions for depositing a second electrode over the surface of the set of oxide materials and the memory material, the second electrode coupled with and the memory material, and depositing a digit line over the second electrode. Some examples of the method 400 and the apparatus described herein may further include operations, features, means, or instructions for depositing the memory material causes the memory material to cover the second channel without filling an entire space of the second channel created by etching the sacrificial material. Some examples of the method 400 and the apparatus described herein may further include operations, features, means, or instructions for applying pressure to the memory material during at least a portion of a duration of heating the memory material.

Some examples of the method 400 and the apparatus described herein may further include operations, features, means, or instructions for forming the stack of material by, depositing the first electrode onto the conductive line, and depositing the sacrificial material onto the first electrode. In some examples of the method 400 and the apparatus described herein, the heating the memory material includes performing a reflow process. In some examples of the method 400 and the apparatus described herein, etching the sacrificial material may include operations, features, means, or instructions for performing a wet etching process.

Some examples of the method 400 and the apparatus described herein may further include operations, features, means, or instructions for depositing the memory material includes a physical vapor deposition process. In some examples of the method 400 and the apparatus described herein, the memory material includes a silicon dioxide material and a chalcogenide material. Some examples of the method 400 and the apparatus described herein may further include operations, features, means, or instructions for heating the memory material may be based on a glass transition temperature of the memory material.

In some examples of the method 400 and the apparatus described herein, the sacrificial material includes a top layer of the stack of material. In some examples of the method 400 and the apparatus described herein, the sacrificial material includes a silicon nitride material.

Figure 5:
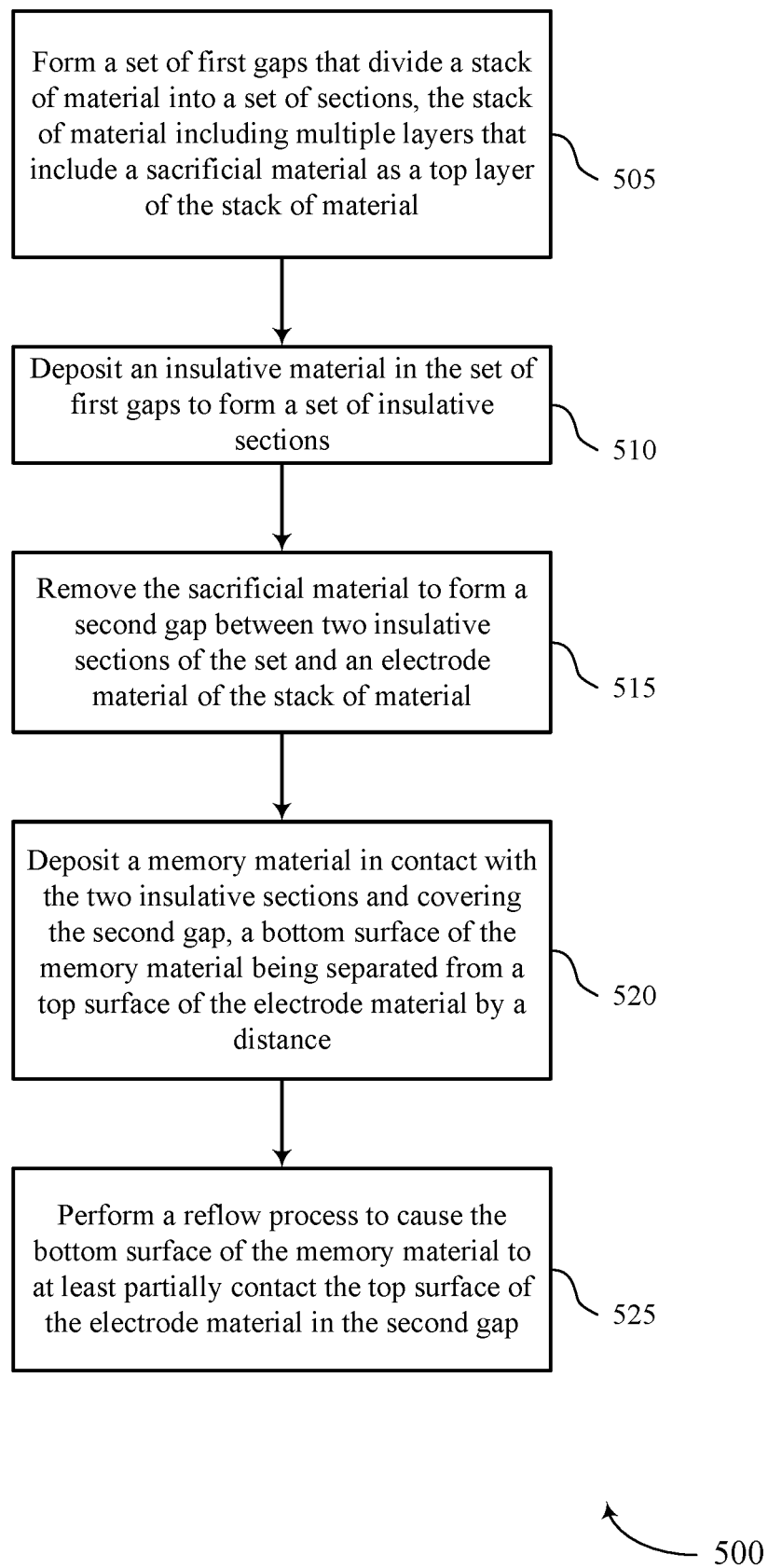

FIG. 5 shows a flowchart illustrating a method or methods 500 that supports techniques for forming memory structures in accordance with aspects of the present disclosure. The operations of method 500 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 505, the method 500 may form a set of first gaps that divide a stack of material into a set of sections, the stack of material including multiple layers that include a sacrificial material as a top layer of the stack of material. The operations of 505 may be performed according to the methods described herein.

At 510, the method 500 may deposit an insulative material in the set of first gaps to form a set of insulative sections. The operations of 510 may be performed according to the methods described herein.

At 515, the method 500 may remove the sacrificial material to form a second gap between two insulative sections of the set and an electrode material of the stack of material. The operations of 515 may be performed according to the methods described herein.

At 520, the method 500 may deposit a memory material in contact with the two insulative sections and covering the second gap, a bottom surface of the memory material being separated from a top surface of the electrode material by a distance. The operations of 520 may be performed according to the methods described herein.

At 525, the method 500 may perform a reflow process to cause the bottom surface of the memory material to at least partially contact the top surface of the electrode material in the second gap. The operations of 525 may be performed according to the methods described herein.

In some examples, an apparatus as described herein may perform a method or methods, such as the method 500. The apparatus may include features, means, or instructions (e.g., a non-transitory computer-readable medium storing instructions executable by a processor) for forming a set of first gaps that divide a stack of material into a set of sections, the stack of material including multiple layers that include a sacrificial material as a top layer of the stack of material, depositing an insulative material in the set of first gaps to form a set of insulative sections, removing the sacrificial material to form a second gap between two insulative sections of the set and an electrode material of the stack of material, depositing a memory material in contact with the two insulative sections and covering the second gap, a bottom surface of the memory material being separated from a top surface of the electrode material by a distance, and performing a reflow process to cause the bottom surface of the memory material to at least partially contact the top surface of the electrode material in the second gap.

In some examples of the method 500 and the apparatus described herein, the stack of material includes a conductive line coupled with a first surface of the electrode material and the sacrificial material coupled with a second surface of the electrode material.

In some examples of the method 500 and the apparatus described herein, performing the reflow process further may include operations, features, means, or instructions for applying thermal energy to the memory material during at least a portion of the reflow process, and applying a pressure to the memory material during at least a portion of the reflow process. Some examples of the method 500 and the apparatus described herein may further include operations, features, means, or instructions for removing a portion of the memory material after the performing the reflow process to expose surfaces of the set of insulative sections.

In some examples of the method 500 and the apparatus described herein, the distance between the bottom surface of the memory material and the top surface of the electrode material after depositing the memory material may be based on a second distance between the two insulative sections. Some examples of the method 500 and the apparatus described herein may further include operations, features, means, or instructions for performing the reflow process causes the memory material to fill the second gap to a height of at least top surfaces of the two insulative sections. In some examples of the method 500 and the apparatus described herein, the performing the reflow process causes the memory material to fill an entire volume of the second gap.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a memory cell formed by, depositing oxide material in each of the set of first channels to form a set of oxide materials, etching the sacrificial material to form a second channel between two oxide materials of the set and the first electrode, depositing a memory material over the two oxide materials and the second channel, the memory material creating a void in the second channel between the memory material and the first electrode, and heating the memory material to cause the memory material to at least partially fill the void in the second channel.

Some examples may further include etching the memory material after the heating to expose a surface of the set of oxide materials. Some examples may further include depositing a second electrode over the surface of the set of oxide materials and the memory material, the second electrode coupled with and the memory material, and depositing a digit line over the second electrode. Some examples may further include depositing the memory material causes the memory material to cover the second channel without filling an entire space of the second channel.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. A method comprising:
   etching a portion of a stack of material to form a channel between a first material and a second material and a top surface of an electrode included in the stack of material;
   depositing a memory material over the channel, the first material, and the second material, the memory material creating a void in the channel extending from the memory material to the top surface of the electrode; and heating the memory material to cause the memory material to at least partially fill the void in the channel.

2. The method of claim 1, further comprising:
etching the stack of material to form a second channel in the stack of material and a third channel in the stack of material; and
depositing, before etching the portion of the stack of material to form the channel, the first material in the second channel and the second material in the third channel.

3. The method of claim 2, wherein a size of a memory cell associated with the memory material in the channel is based at least in part on etching the stack of material to form the second channel and the third channel.

4. The method of claim 1, further comprising:
etching, after heating the memory material, the memory material to expose a top surface of the first material and a top surface of the second material.

5. The method of claim 4, further comprising:
depositing, after etching the memory material, the electrode in contact with the memory material, the top surface of the first material, and the top surface of the second material, the electrode coupled with the memory material; and
depositing a conductive line over the electrode.

6. The method of claim 1, further comprising:
applying pressure to the memory material during at least a portion of a duration of heating the memory material.

7. The method of claim 1, wherein:
the stack of material comprises a conductive line, the electrode, and a sacrificial material, the portion of the stack of material comprising the sacrificial material and corresponding to a top layer of the stack of material; and
the second material comprises an oxide material.

8. A method, comprising:
etching a stack of material to form a plurality of first channels that divide the stack of material into a plurality of sections;
etching a portion of each section of the plurality of sections to form a plurality of second channels over top surfaces of a respective electrode included in each section and between a plurality of second materials deposited in each of the first channels;
depositing a memory material over the plurality of second materials and the plurality of second channels, the memory material creating a void in each of the plurality of second channels extending from the memory material to a top surface of a respective electrode included in each section; and
heating the memory material to cause the memory material to at least partially fill the void in the each of the plurality of second channels.

9. The method of claim 8, further comprising:
etching, after heating the memory material, the memory material to expose a top surface of each of the second materials of the plurality of second materials.

10. The method of claim 9, further comprising:
depositing, after etching the memory material, a second electrode in contact with the memory material and the top surfaces of the second materials, the second electrode coupled with the memory material; and
depositing a conductive line over the second electrode.

11. The method of claim 8, further comprising:
applying pressure to the memory material during at least a portion of a duration of heating the memory material.

12. The method of claim 8, wherein a size of a memory cell associated with the memory material in a respective second channel of the plurality of second channels is based at least in part on etching the stack of material to form the plurality of first channels.

13. The method of claim 8, wherein:
the stack of material comprises a conductive line, the electrode, and a sacrificial material, the portion of each section comprising the sacrificial material and corresponding to a top layer of the stack of material; and
the plurality of second materials comprise an oxide material.

14. A method, comprising:
removing a first portion from a stack of material to form a first gap between a first material and a second material and an electrode included in the stack of material;
depositing a memory material in contact with the first material and the second material and covering the first gap to create a void in the first gap that extends from the memory material to a top surface of the electrode; and
performing a reflow process to cause a bottom surface of the memory material to at least partially contact the top surface of the electrode in the first gap.

15. The method of claim 14, further comprising:
forming a second gap on in the stack of material and a third gap in the stack of material; and
depositing, before removing the first portion from the stack of material to form the first gap, the first material in the second gap and the second material in the third gap.

16. The method of claim 14, wherein performing the reflow process further comprises:
applying thermal energy to the memory material during at least a first portion of the reflow process; and
applying a pressure to the memory material during at least a second portion of the reflow process.

17. The method of claim 14, further comprising:
removing a portion of the memory material after performing the reflow process to expose a top surface of the first material and a top surface of the second material.

18. The method of claim 17, further comprising:
depositing, after removing the portion of the memory material, the electrode over the memory material, the top surface of the first material and the top surface of the second material, the electrode coupled with the memory material; and
depositing a conductive line over the electrode.

19. The method of claim 14, wherein:
the memory material comprises silicon dioxide, a chalcogenide material, or a combination thereof; and
the first portion of the stack of material comprises a silicon nitride material.

20. The method of claim 14, wherein:
the stack of material comprises a conductive line, the electrode, and a sacrificial material, the first portion comprising the sacrificial material and corresponding to a top layer of the stack of material;
the first material comprises an insulative material; and
the second material comprises the insulative material.

* * * * *